(12) United States Patent
Kim et al.

(10) Patent No.: US 8,117,516 B2
(45) Date of Patent: Feb. 14, 2012

(54) APPARATUS AND METHOD FOR SIGNAL TRANSMISSION/RECEPTION IN A COMMUNICATION SYSTEM

(75) Inventors: Dong-Ho Kim, Seoul (KR); Yung-Soo Kim, Seongnam-si (KR); Tak-Ki Yu, Suwon-si (KR); Keum-Chan Whang, Seoul (KR); Kwang-Soon Kim, Seoul (KR); Hyo-Yol Park, Seoul (KR)

(73) Assignees: Samsung Electronics Co., Ltd (KR); Industry-Academic Cooperation Foundation, Yonsei University (KR)

( * ) Notice: Subject to any disclaimer, the term of this patent is extended or adjusted under 35 U.S.C. 154(b) by 1135 days.

(21) Appl. No.: 11/935,259

(22) Filed: Nov. 5, 2007

(65) Prior Publication Data

US 2008/0109708 A1 May 8, 2008

(30) Foreign Application Priority Data

Nov. 6, 2006 (KR) ........................ 10-2006-0109145

(51) Int. Cl.
*H03M 13/00* (2006.01)
(52) U.S. Cl. ...................................... 714/755
(58) Field of Classification Search ........................ None
See application file for complete search history.

(56) References Cited

U.S. PATENT DOCUMENTS

| | | | |
|---|---|---|---|
| 7,395,494 B2 | 7/2008 | Lee et al. | |
| 7,502,987 B2 * | 3/2009 | Kyung et al. | 714/781 |
| 7,657,824 B2 | 2/2010 | Ha et al. | |
| 7,783,961 B2 * | 8/2010 | Yue et al. | 714/790 |
| 2005/0246616 A1 * | 11/2005 | Choi et al. | 714/801 |
| 2005/0283708 A1 * | 12/2005 | Kyung et al. | 714/758 |
| 2005/0283709 A1 * | 12/2005 | Kyung et al. | 714/758 |
| 2006/0190801 A1 * | 8/2006 | Shin et al. | 714/758 |

FOREIGN PATENT DOCUMENTS

| | | |
|---|---|---|
| KR | 100550101 | 2/2006 |
| KR | 1020060047842 | 5/2006 |
| KR | 1020060080448 | 7/2006 |

OTHER PUBLICATIONS

Song-Nam Hong, Jaeweon Cho, and DS Park, Rate-Compatible Puncturing for Finite-Length Low-Density Parity-Check Codes With Zigzag Parity Structure, 2006,The 17th Annual IEEE International Symposium on Personal, Indoor and Mobile Radio Communications.*
Pishro-Nik, H. ; Fekri, F. ; Results on punctured LDPC codes, Oct. 24-29, 2004, IEEE, pp. 215-219.*

* cited by examiner

*Primary Examiner* — Jeffrey A Gaffin
*Assistant Examiner* — Guerrier Merant
(74) *Attorney, Agent, or Firm* — The Farrell Law Firm, P.C.

(57) ABSTRACT

A method and an apparatus for transmitting a signal in a communication system are provided. An information vector is encoded according to a Low Density Parity Check (LDPC) encoding scheme, thereby generating an LDPC codeword. Minimum surviving check nodes are reserved for recovery of punctured nodes in the LDPC codeword. A check node is selected having a smallest cost function from among unreserved check nodes. A variable node is selected being unpunctured and having a smallest cost function from among variable nodes connected to the selected check node. The selected variable node is punctured when the selected variable node is not connected to the reserved check node. A stopping set check is performed when the selected variable node is connected to the reserved check node. The variable node is punctured when the stopping set check has been successfully performed. The check node is selected until there remains no variable node to be punctured and puncturing the variable node.

12 Claims, 13 Drawing Sheets

APPARATUS AND METHOD FOR SIGNAL TRANSMISSION/RECEPTION IN A COMMUNICATION SYSTEM

PRIORITY

This application claims priority under 35 U.S.C. §119(a) to an application entitled "Apparatus and Method for Signal Transmission/Reception in A Communication System" filed in the Korean Intellectual Property Office on Nov. 6, 2006 and assigned Serial No. 2006-109145, the contents of which are incorporated herein by reference.

BACKGROUND OF THE INVENTION

1. Field of the Invention

The present invention relates to a communication system, and more particularly, to an apparatus and a method for transmitting and receiving signals in a communication system.

2. Description of the Related Art

In general, communication systems are being developed to provide mobile stations with a service capable of transmitting/receiving a larger capacity of data at a higher speed. Therefore, use of Low Density Parity Check (LDPC) codes, suitable for transmission and reception of high-speed large-capacity data, have been considered in communication systems.

In addition to LDPC code, the use of a Hybrid Automatic Retransmission reQuest (HARQ) scheme and an Adaptive Modulation and Coding (AMC) scheme have been also considered for transmission and reception of high-speed large-capacity data. In order to use the HARQ scheme or the AMC scheme, a communication system must support various coding rates.

As described above, conventional communication systems have considered the use of various schemes employing various rates, such as an HARQ scheme and an AMC scheme, as well as the use of an LDPC code, for high-speed large-capacity data transmission and reception. However, when using the LDPC code, there is a limit to the number of supportable coding rates because a large capacity of memory is required for storage of a large random parity check matrix that can be expressed by a bipartite graph. Therefore, there has been a need in the industry for a scheme capable of supporting various coding rates that transmits/receives a signal using various coding rates without an increase in complexity of a coder and a decoder in a communication system. Hereinafter, an example of a signal transmission/reception method for supporting various coding rates in a communication system using the LDPC code is described.

FIG. 1 is a diagram illustrating a 1-SR node on a typical bipartite graph.

Referring to FIG. 1, the 1-SR node is defined as a variable node having, from among the check nodes neighboring the 1-SR node, at least one neighboring check node connected to only unpunctured variable nodes except for the 1-SR node itself As used herein, each of the unpunctured variable nodes is defined as a 0-SR node and refers to a variable node that is not punctured. As a result, the 1-SR node is a node that can be restored through one time iterative decoding, according to an iterative decoding scheme.

FIG. 2 is a diagram illustrating a k-SR node on a typical bipartite graph.

Referring to FIG. 2, the k-SR node is defined as a variable node having check nodes neighboring the k-SR node. The neighboring check nodes include at least one neighboring check node connected to one (k−1)-SR node except for the k-SR node itself and another neighboring check node connected to 0~(k−1)-SR nodes. As a result, the k-SR node is a node that can be restored through k times of iterative decoding according to an iterative decoding scheme.

In this case, a punching order of the k-SR nodes is determined bit by bit. First, one 1-SR node having the highest degree in a 1-SR node group is selected. Then, all check nodes of the selected 1-SR node are reserved. The reserved check nodes are used in recovering corresponding SR nodes.

Next, a 1-SR node connected to the largest number of unreserved check nodes is selected, and those unreserved check nodes are then reserved. If there are more than one 1-SR nodes connected to the same number of unreserved check nodes, one 1-SR node having the lowest degree from among the multiple 1-SR nodes is punctured.

Therefore, after the puncturing order of all the 1-SR nodes is determined, the puncturing order of 2-SR nodes is determined in the same manner as that of the 1-SR nodes. According to this puncturing scheme, the puncturing is performed in a direction in which the number of surviving check nodes of each punctured variable node increases.

It is well known that the above-described puncturing scheme has a high probability that, the smaller the value of k, the smaller the number of unpunctured variable nodes included in a recovery tree of the k-SR node. However, as the value of k increases, a recovery tree of a k-SR node having the smaller k value may include more unpunctured variable nodes than a recovery tree of a k-SR node having the larger k value.

Further, in the puncturing scheme, if the number of surviving check nodes of a certain k-SR node is increased according to an increase in the puncturing amount (i.e. the puncturing frequency), the number of check nodes that may otherwise become surviving check nodes of another k-SR node is reduced, so as to reduce reliability in recovering the nodes. Furthermore, the information flow of unpunctured variable nodes is initially out-obstructed, and it is thus difficult to expect improvement of the overall performance.

Accordingly, it is necessary to minimize the number of unpunctured variable nodes included in a recovery tree in puncturing, and to puncture a variable node having a degree as low as possible, thereby uniformly distributing surviving check nodes to all punctured variable nodes.

SUMMARY OF THE INVENTION

The present invention has been made to address the above problems and/or disadvantages and to provide at least the advantages described below. Accordingly, an aspect of the present invention provides an apparatus and a method for transmitting and receiving signals in a communication system using an LDPC code.

Another aspect of the present invention provides an apparatus and a method for supporting various coding rates in signal transmission/reception in a communication system using an LDPC code.

An additional aspect of the present invention provides an apparatus and a method for transmitting and receiving signals through an effective puncturing scheme in a communication system using an LDPC code.

A further aspect of the present invention provides an apparatus and a method for signal transmission and reception in a communication system using an LDPC code, which can minimize the number of unpunctured variable nodes of a recovery tree of reserved check nodes and each punctured node, thereby maximizing the recovery correctness.

According to one aspect of the present invention, a method for transmitting a signal in a communication system is provided. An information vector is encoded according to a Low Density Parity Check (LDPC) encoding scheme, thereby generating an LDPC codeword. Minimum surviving check nodes are reserved for recovery of punctured nodes in the LDPC codeword. A check node is selected having a smallest cost function from among unreserved check nodes. A variable node is selected being unpunctured and having a smallest cost function from among variable nodes connected to the selected check node. The selected variable node is punctured when the selected variable node is not connected to the reserved check node. A stopping set check is performed when the selected variable node is connected to the reserved check node. The variable node is punctured when the stopping set check has been successfully performed. The check node is selected until there remains no variable node to be punctured and puncturing the variable node.

According to another aspect of the present invention, an apparatus for transmitting a signal in a communication system is provided. The apparatus includes an encoder for encoding an information vector according to a Low Density Parity Check (LDPC) encoding scheme, thereby generating an LDPC codeword. The apparatus also includes a puncturing unit for reserving minimum surviving check nodes for recovery of punctured nodes in the LDPC codeword, selecting a check node having a smallest cost function from among unreserved check nodes, selecting a variable node being unpunctured and having a smallest cost function from among variable nodes connected to the selected check node, puncturing the selected variable node when the selected variable node is not connected to the reserved check node, performing a stopping set check when the selected variable node is connected to the reserved check node, puncturing the variable node when the stopping set check has been successfully performed, and selecting the check node until there remains no variable node to be punctured and puncturing the variable node.

BRIEF DESCRIPTION OF THE DRAWINGS

The above and other aspects, features and advantages of the present invention will be more apparent from the following detailed description when taken in conjunction with the accompanying drawings, in which.

DETAILED DESCRIPTION OF THE PREFERRED EMBODIMENTS

Preferred embodiments of the present invention are described in detail with reference to the accompanying drawings. Detailed descriptions of constructions or processes known in the art may be omitted to avoid obscuring the subject matter of the present invention.

Embodiments of the present invention provide an apparatus and a method for transmitting and receiving signals in a communication system using Low Density Parity Check (LDPC) codes. More specifically, embodiments of the present invention provide an apparatus and a method for supporting various coding rates in signal transmission/reception in a communication system using LDPC codes. To this end, it is assumed that embodiments of the present invention employ, for example, a puncturing scheme.

As used herein, a parity check matrix H having m rows and n columns of LDPC codes can be expressed by a bipartite graph in an embodiment of the present invention. In this case, when a variable node and a check node are interconnected through at least one branch, the connected check node and variable node are defined as "neighboring each other."

Figure 1:
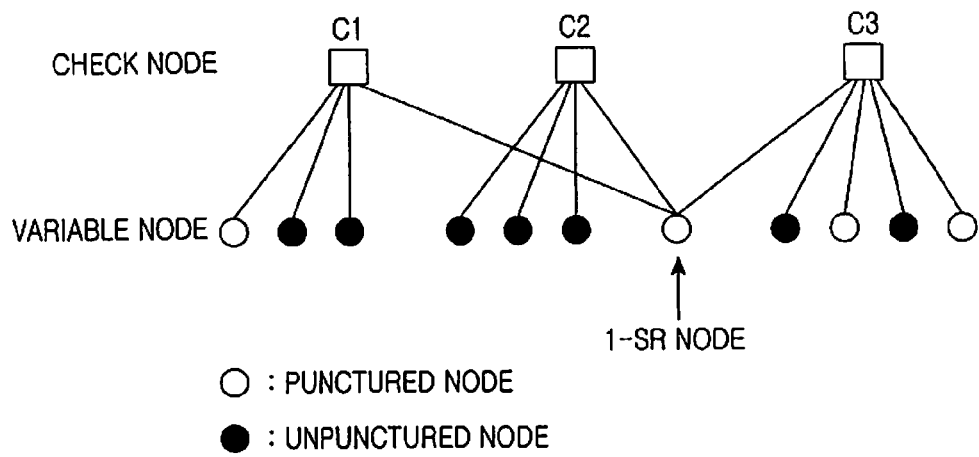
FIG. 1 is a diagram illustrating a 1-SR node on a typical bipartite graph.
Figure 2:
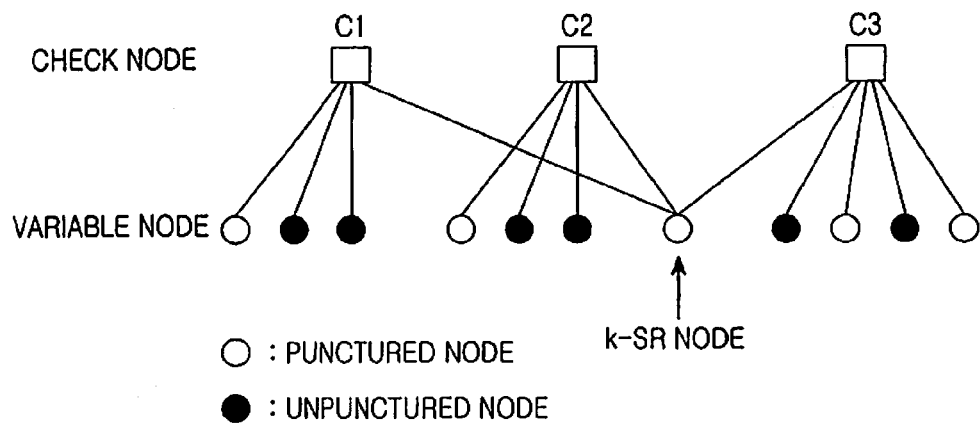
FIG. 2 is a diagram illustrating a k-SR node on a typical bipartite graph.
Figure 3:
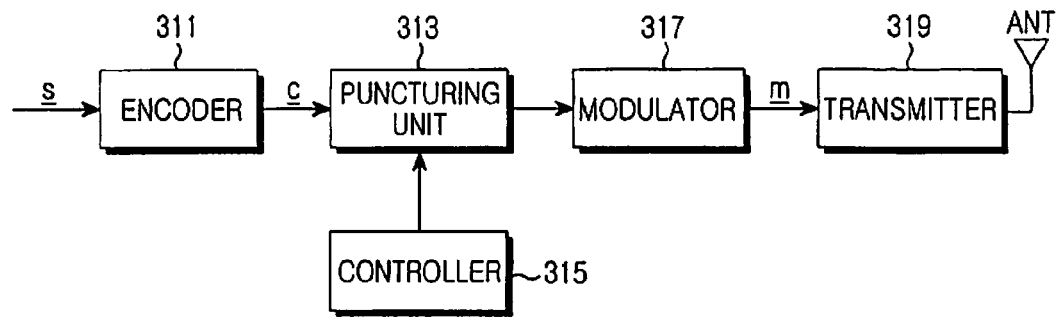
FIG. 3 is a block diagram illustrating a structure of a transmission apparatus in a communication system using an LDPC code according to an embodiment of the present invention.

FIG. 3 is a block diagram illustrating a structure of a transmission apparatus in a communication system using an LDPC code according to an embodiment of the present invention.

Referring to FIG. 3, the transmission apparatus in the communication system includes an encoder 311, a puncturing unit 313, a controller 315, a modulator 317, and a transmitter 319.

First, when desired information data to be transmitted by the transmission apparatus (i.e. an information vector $\underline{s}$) is generated, the information vector $\underline{s}$ is transferred to the encoder 311.

The encoder 311 encodes the information vector $\underline{s}$ according to a preset encoding scheme and then outputs the encoded information vector to the puncturing unit 313. The encoder 311 generates a codeword vector $\underline{c}$ by encoding the information vector $\underline{s}$, and then outputs the generated codeword vector $\underline{c}$ to the puncturing unit 313. Herein, the codeword vector $\underline{c}$ is an LDPC codeword.

The puncturing unit 313 punctures the codeword vector $\underline{c}$ output from the encoder 311 under the control of the controller 315, and then outputs the punctured codeword vector to the modulator 317.

Herein, the controller 315 controls the puncturing unit 313 so that the number of unpunctured variable nodes included in a recovery tree is minimized and a variable node having a degree as low as possible is punctured. As a result of such control by the controller 315, surviving check nodes are uniformly distributed to all punctured variable nodes. The controller 315 and the puncturing operation of the puncturing unit 313 under the control of the controller 315 are described below.

The modulator 317 modulates the codeword vector c punctured in the puncturing unit 313 according to a preset modulation scheme, and then outputs the modulated vector to the transmitter 319. At this time, the modulator 317 modulates the punctured codeword vector into a modulation vector m and outputs the generated modulation vector to the transmitter 319.

The transmitter 319 generates a transmission signal by processing the modulation vector m output from the modulator 317 and transmits the transmission signal via an antenna.

Although not separately described above in relation to FIG. 3, it is assumed that the information on the puncturing scheme of the puncturing unit 313 is commonly stored in the transmission apparatus and the reception apparatus corresponding to the transmission apparatus and is used for the signal transmission and reception.

Figure 4:
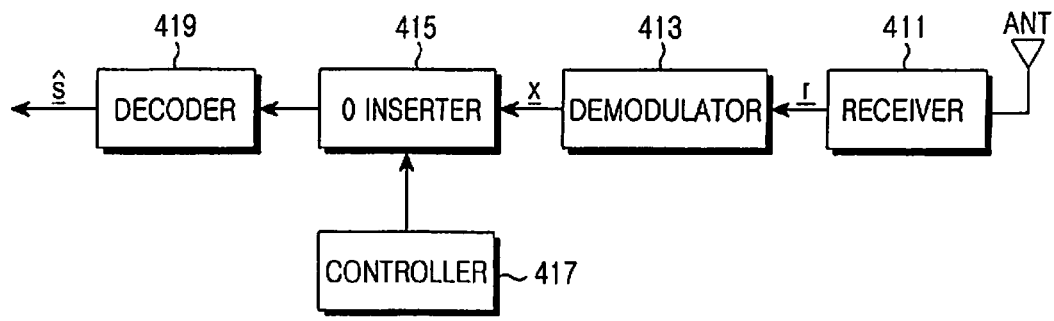
FIG. 4 is a block diagram illustrating a structure of a reception apparatus in a communication system using an LDPC code according to an embodiment of the present invention.

FIG. 4 is a block diagram illustrating a structure of a reception apparatus in a communication system using an LDPC code according to an embodiment of the present invention.

Referring to FIG. 4, the reception apparatus includes a receiver 411, a demodulator 413, a zero inserter 415, a controller 417, and a decoder 419.

First, the signal transmitted by the transmission apparatus is received by the reception apparatus.

The receiver 411 processes the signal received via an antenna, and then outputs the processed signal to the demodulator 413. At this time, the receiver 411 generates a reception vector r through the signal processing.

The demodulator 413 demodulates the reception vector r output from the receiver 411 and outputs the demodulated signal to the zero inserter 415. The demodulator 413 uses a demodulation scheme corresponding to the modulation scheme used in the modulator of the transmission apparatus and generates a demodulation vector x as the demodulated signal.

Then, the zero inserter 415 inserts a log likelihood ratio of zero into the modulation vector x output from the demodulator 413 according to the control of the controller 417. Here, the zero inserter 415 performs an operation corresponding to the puncturing scheme of the puncturing unit of the transmission apparatus.

The controller 417 controls the zero inserter 415 so that the zero inserter 415 inserts the log likelihood ratio of zero into the modulation vector x output from the demodulator 413. A position where the log likelihood ratio of zero is inserted in the zero inserter 415 is identical to a position where a parity bit is punctured in the codeword vector c.

The decoder 419 decodes and outputs the signal output from the zero inserter 415. The signal finally output from decoder 419 after decoding is an information vector ŝ, and the decoder employs a decoding scheme corresponding to the encoding scheme of the encoder of the transmission apparatus. For example, the decoding scheme (i.e. an LDPC decoding scheme) may be an iterative decoding algorithm based on a sum-product algorithm.

It is assumed that the receiver corresponding to the transmission apparatus using the puncturing scheme of an embodiment of the present invention uses a general LDPC code based demodulator for performing the demodulation through reliability spread. Before describing the puncturing scheme used in an embodiment of the present invention, parameters used in an embodiment of the present invention are defined as follows.

v: a variable node (which is either a variable node before the puncturing or a k-SR node after the puncturing),
c: a check node,
V: a set of all variable nodes,
C: a set of all check nodes,
$V_c$: a set of variable nodes connected to a check node c,
$C_v$: a set of check nodes connected to a variable node v,
T(v, c, k): a recovery tree of a surviving check node c that has at least a minimum number of (k−1)-SR nodes and 0-SR nodes in a sub-tree from among k-SR nodes v and $C_v$,
s(v): a sum of s(v') values of each sub-tree in T(v, c, k), wherein v' corresponds to one of the (k−1)-SR node and the 0-SR node, and s(v') has a value of 1 for the 0-SR node,
S(c): a sum of s(v) values of variable nodes v belonging to $V_c$,
k(v): a sum of s(c) values of check nodes c belonging to $C_v$,
r(c): a reserved state of a check node c, which indicates "reserved" when it has a value of 1, and indicates "unreserved" when it has a value of 0, wherein one-reserved check node is not reselected,
r(v): a sum of r(c) values of check nodes c belonging to $C_v$, which indicates how many reserved check nodes c a variable node v is connected to,
p(v): a puncturing state of a variable node v, which indicates "unpunctured" when it has a value of 1, and indicates "punctured" when it has a value of 0,
b(v): a degree of a variable node v,
p: the number of nodes to be punctured,
$N_p$: the number of all variable nodes to be punctured,
$V_c^r$: a set of variable nodes v belonging to $V_c$, wherein p(v) of the variable nodes v is 1 and r(v) of the variable nodes v has a minimum value,
R(c): a minimum value from among r(v) of variable nodes v belonging to $V_c$,
B(c): a minimum value from among b(v) of variable nodes v belonging to $V_c^r$,
K(c): a minimum value from among k(v) of variable nodes v belonging to $V_c$, and
t(v) a parameter indicating if a variable node v corresponds to an information part or a parity part, which indicates that a variable node v corresponds to a parity part when it has a value of 0, and indicates that a variable node v corresponds to an information part when it has a value of 1.

Figure 5:
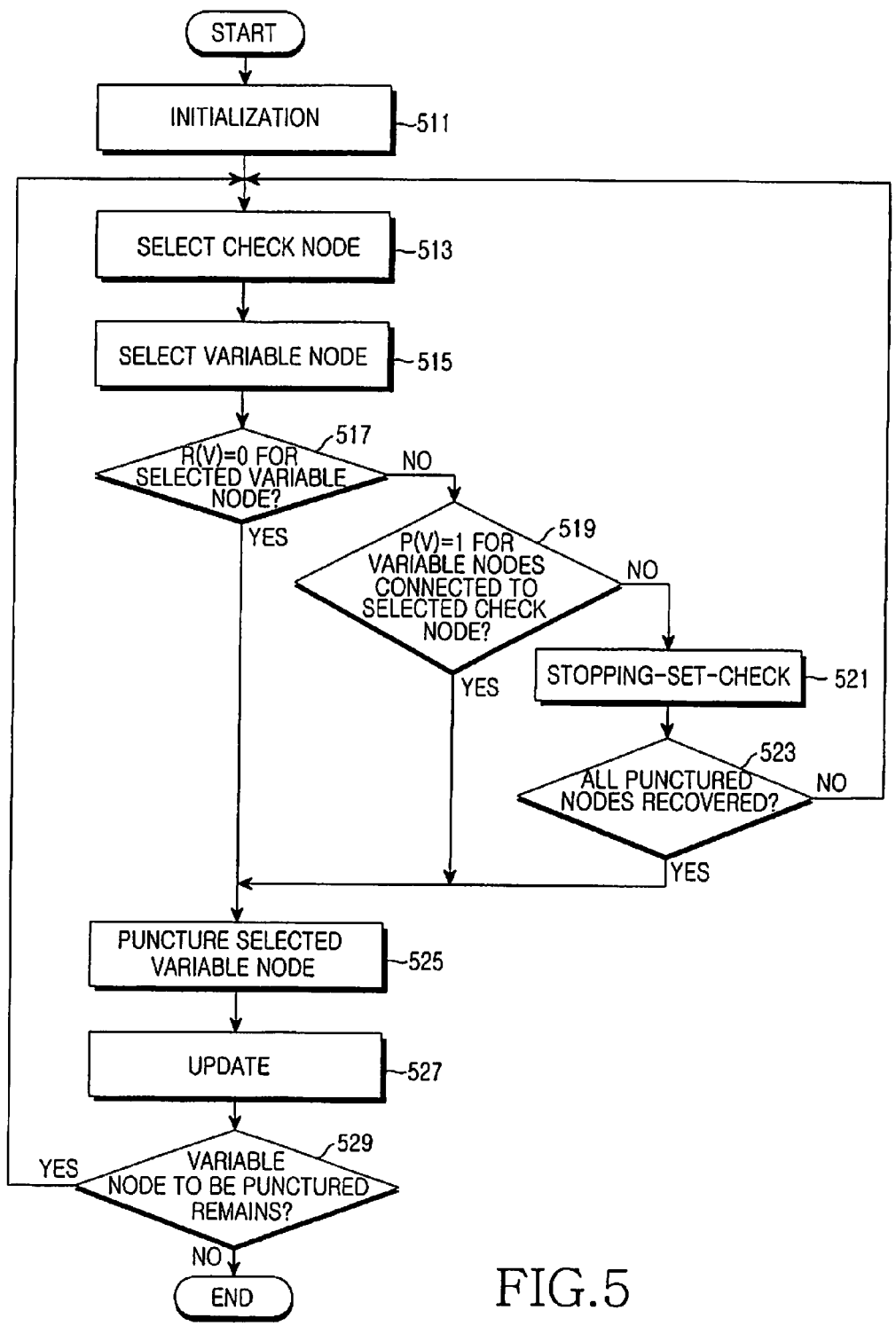
FIG. 5 is a flow diagram schematically illustrating a puncturing scheme according to an embodiment of the present invention.

FIG. 5 is a flow diagram illustrating a puncturing scheme according to an embodiment of the present invention.

Referring to FIG. 5, the transmission apparatus performs initialization of parameters in step 511, and then proceeds to step 513. The transmission apparatus initializes all the k-SR nodes, which include s(v) and r(v), and p(v) for a variable node v. In this step, s(v) is initialized to 1, r(v) is initialized to 0, and p(v) is initialized to 1. Further, the transmission apparatus initializes r(c) for all the check nodes c to 0 and initializes p into $N_p$.

In step 513, the transmission apparatus selects a check node and proceeds to step 515.

Before selecting the check node, the transmission apparatus reserves a minimum number of surviving check nodes that can recover punctured nodes neighboring the check node in an LDPC codeword. The transmission apparatus selects a check node having the smallest cost function C(c) from among unreserved check nodes (r(c)=0). When there are a plurality of check nodes having the smallest cost function, the transmission apparatus may select in an optional and random way, for example, the transmission apparatus may select the check nodes one by one from either a foremost check node or a rearmost check node.

The transmission apparatus selects a variable node in step 515 and proceeds to step 517. The transmission apparatus selects a variable node, which is unpunctured (p(v)=1) and has the smallest cost function C(v), from among variable nodes connected to the check node selected in step 513. When there is a plurality of variable nodes having the same smallest cost function, the transmission apparatus may select in an optional and random way, for example, the transmission apparatus may select the variable nodes one by one from either a foremost variable node or a rearmost variable node. The cost function C(c) of the check node and the cost function C(v) of the variable node are defined by Equation (1) below.

$$C(c)=S(c)+R(c)w^{-1}+B(c)w^{-2}+K(c)w^{-3}$$

$$C(v)=r(v)+b(v)w^{-1}+k(v)w^{-2} \qquad (1)$$

In Equation (1), S(c) denotes a sum of s(v) values of variable nodes v included in $V_c$, R(c) refers to a minimum value from among r(v) values of variable nodes v included in $V_c$, and B(c) denotes a minimum value of b(v) of variable nodes v having a minimum r(v) value included in $V_c^r$. Also, b(v) denotes a degree of a variable node v, K(c) denotes a minimum value from among k(v) of variable nodes v included in $V_c$, and $k(v)$ denotes a sum of S(c) values of check nodes c belonging to $C_v$. Further, w denotes a predetermined real number having a large value. As noted from Equation (1), the larger the value of the cost function, the earlier the puncturing order.

The reserved check node is described below. Check nodes having r(c) of 1 (reserved check nodes) serve as minimum surviving check nodes for recovery of corresponding neighboring punctured nodes. Use of the above-described reservation scheme allows uniform allocation of surviving check nodes to punctured nodes, so that the punctured nodes have the same recovery reliability. Further, the higher the r(v) of a variable node, the more the punctured nodes recovered by the variable node. As a result, the higher the r(v) of a variable node, the later the allocated puncturing order of the variable node. Therefore, by using the above-described reservation method, it is possible to prevent punctured nodes from configuring a stopping set. As a result, it is possible to prevent failure in recovering any punctured node.

The stopping set refers to a set of variable nodes connected to a set of check nodes through at least two branches. In other words, the stopping set refers to a set of variable nodes, only within which information is exchanged without the exchange of the information with another variable node or another set of variable nodes. Therefore, once a stopping set is configured by punctured nodes, the punctured nodes within the stopping set cannot be recovered, no matter how many times the iterative decoding is performed.

Meanwhile, when a large puncturing quantity, as much as even a variable node having r(v) larger than 0 should be punctured, is necessary, it is probable that the stopping set is inevitable. Therefore, a method for avoiding configuration of a stopping set is described hereinafter in detail.

In step 517, the transmission apparatus determines if r(v) of a selected variable node v is 0.

As a result of the determination, when r(v) is 0, the transmission apparatus proceeds to step 525. From the value of r(v), the transmission apparatus can determine if the selected variable node is connected to a reserved check node c.

In step 525, the transmission apparatus punctures variable nodes that are not connected to the reserved check nodes, and the proceeds to step 527.

However, as a result of the determination in step 517, when r(v) is not 0, the transmission apparatus proceeds to step 519. In step 519, the transmission apparatus determines if each of all variable nodes v connected to the selected check node has been punctured, that is, if p(v)=1.

As a result of the determination in step 519, when the variable node has not been punctured, that is, when p(v)=1, the transmission apparatus proceeds to step 525.

However, as a result of the determination in step 519, when the variable node has been punctured, that is, p(v)=1 is not satisfied, the transmission apparatus proceeds to step 521.

In step 521, the transmission apparatus performs a stopping-set-check, and then proceeds to step 523. The stopping-set-check is described in further detail below with reference to FIG. 6.

In step 523, the transmission apparatus determines if all punctured nodes (i.e., punctured variable nodes) have been recovered. This step corresponds to a step of determining if the stopping-set-check has been successfully performed. The transmission apparatus proceeds to step 525 when the stopping-set-check has been successfully performed, and proceeds to step 513 when the stopping-set-check has not been successfully performed.

As a result of the determination, when all the punctured nodes have been recovered, the transmission apparatus proceeds to step 525. However, when all the punctured nodes have not been recovered, the transmission apparatus proceeds to step 513.

In step 527, the transmission apparatus performs an update process, and then proceeds to step 529. In step 527, the transmission apparatus updates r(c) of the selected check node c to "1." Further, the transmission apparatus updates p(v) of all variable nodes v' neighboring the selected variable node v and check node c except for the selected variable node v to "0" while increasing r(v') by "1," and updates s(v) to a sum of s(v') of all variable nodes v' while decreasing p by "1." In addition, the transmission apparatus updates C(c) and C(v) in accordance with the above-described parameter definition.

In step 529, the transmission apparatus determines if a node exists to be punctured, that is, if p is 0. As a result of the determination, when there does not exist a node to be punctured, that is, if p is 0, the transmission apparatus terminates the process. Further, as a result of the determination, when there exists a node to be punctured, that is, if p is not 0, the transmission apparatus proceeds to step 513.

By puncturing the variable nodes, it is possible to puncture an LDPC codeword input to the puncturing unit.

Hereinafter, the stopping-set-check in step 521 is described with reference to FIG. 6.

Figure 6:
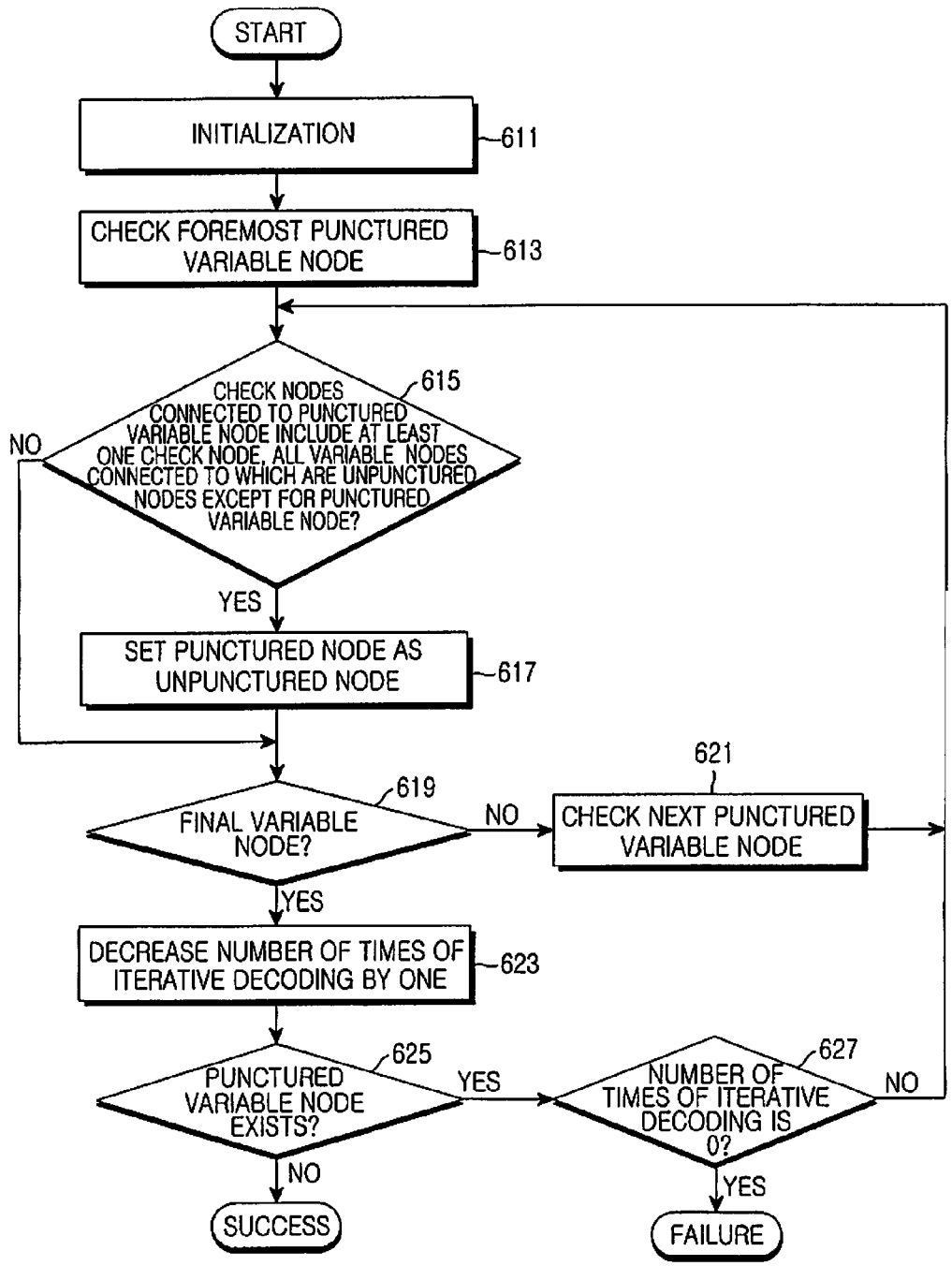
FIG. 6 is a flow diagram schematically illustrating a stopping-set-check according to an embodiment of the present invention.

Referring to FIG. 6, the transmission apparatus performs initialization in step 611, and then proceeds to step 613. The transmission apparatus initializes p'(v), which denotes a puncturing state of each of already punctured variable nodes and currently selected variable nodes to be punctured, to "0," and initializes p'(v) of the other variable nodes to "1." Further, transmission apparatus initializes iter, indicating the current number of times of iterative decoding, to MAX_iter, indicating a maximum number of times of iterative decoding to be performed by a reception apparatus.

In step 613, the transmission apparatus starts an orderly examination from a foremost (i.e. leftmost) punctured variable node v*, and then proceeds to step 615.

In step 615, the transmission apparatus determines if the check nodes connected to the punctured variable node v* include at least one check node, all variable nodes connected to which are unpunctured nodes except for the punctured variable node v*.

As a result of the determination, when the check nodes connected to the punctured variable node v* include at least one check node, all variable nodes connected to which are unpunctured nodes except for the punctured variable node v*, the transmission apparatus proceeds to step 617.

In step 617, the transmission apparatus sets the punctured variable node to a recovered node, that is, the transmission apparatus updates p'(v*) to 1, and then proceeds to step 619.

However, as a result of the determination, when the check nodes connected to the punctured variable node v* do not include any check node, all variable nodes connected to which are unpunctured nodes except for the punctured variable node v*, the transmission apparatus proceeds to step 619.

In step 619, the transmission apparatus determines if the current punctured variable node v* is the last one. As a result of the determination, when the current punctured variable node v* is not the last one, the transmission apparatus proceeds to step 621.

In step 621, the transmission apparatus examines a next punctured variable node, and then proceeds to step 615.

However, as a result of the determination, when the current punctured variable node v* is the last one, the transmission apparatus proceeds to step 623.

In step 623, the transmission apparatus decreases the number of times of iterative decoding by one, that is, the transmission apparatus decreases iter by one, and then proceeds to step 625. In step 625, the transmission apparatus determines if variable node indicates 'punctured(p'(v)=0)'.

As a result of determination, when the variable node indicates 'punctured(p'(v)=0)', the stopping-set-check is concluded as a success. Therefore, when there does not exist an unpunctured variable node before the number of times of iterative decoding is exhausted, the stopping-set-check is concluded as a success. However, as a result of the determination, when the variable node indicates 'unpunctured(p'(v)=1)', the transmission apparatus proceeds to step 627.

In step 627, the transmission apparatus determines if the current number iter of times of iterative decoding is "0." As a result of the determination, when iter is "0," the stopping-set-check is concluded as a failure. However, as a result of the determination, when iter is not "0," the transmission apparatus proceeds to step 615.

The above-described process according to a puncturing scheme of an embodiment of the present invention is performed by the puncturing unit under the control of the controller within the transmission apparatus. Further, in the puncturing, since an embodiment of the present invention does not discriminate between the information part and the parity part, it is possible to puncture either the information part or the parity part. Further, in puncturing the LDPC codes, puncturing of the parity part other than the information part can guarantee a minimum performance against performance degradation due to the puncturing.

Conditions for the stopping-set-check according to an embodiment of the present invention are that a current selected bit to be punctured should protect another punctured bit or that a selected check node already includes another punctured variable node. On these conditions, the transmission apparatus checks the stopping set. The stopping-set-check checks if a current variable node to be punctured can be recovered through iterative decoding of another variable node.

In a puncturing scheme according to an embodiment of the present invention, a variable node having the largest r(v) value is the most important variable node. Therefore, the locations of variable nodes are rearranged by allocating the variable nodes to the information part in a sequence according to the importance of the variable nodes, that is, in a sequence according to the magnitudes of the r(v) values. In a parity check matrix, variable nodes correspond to rows, and an exchange of two rows does not change the attribute of linear block codes. Therefore, by reconfiguring the rows according to the r(v) values, reconfiguring an encoder through the reconfigured rows, and then encoding an information vector by the newly configured encoder, it is possible to puncture only the parity part while keeping the puncturing positions.

Also, it is possible to puncture only the parity part without reconfiguration of the encoder in a puncturing scheme, that is, without changing the encoder. By adding one parameter and revising the cost function of a variable node, it is possible to use the existing encoder without change. The revised cost function can be defined by Equation (2) below.

$$C(v)=t(v)+r(v)^{-1}+b(v)w^{-2}+k(v)w^{-3} \quad (2)$$

In Equation (2) defining the revised cost function, t(v) has a value of "0" when the variable node v is a parity part, and has a value of "1" when the variable node v is an information part. Further, S(c), R(c), B(c), and K(c) are calculated only for a variable node in which t(v) is "0."

In Equation (2), parameters are re-defined as follows.

R(c): a minimum value from among r(v) of variable nodes v, which belong to $V_c$ and have t(v) of "0."

Next, a conventional recovery tree and a recovery tree according to an embodiment of the present invention are described with reference to FIGS. 7A and 7B.

Figure 7:
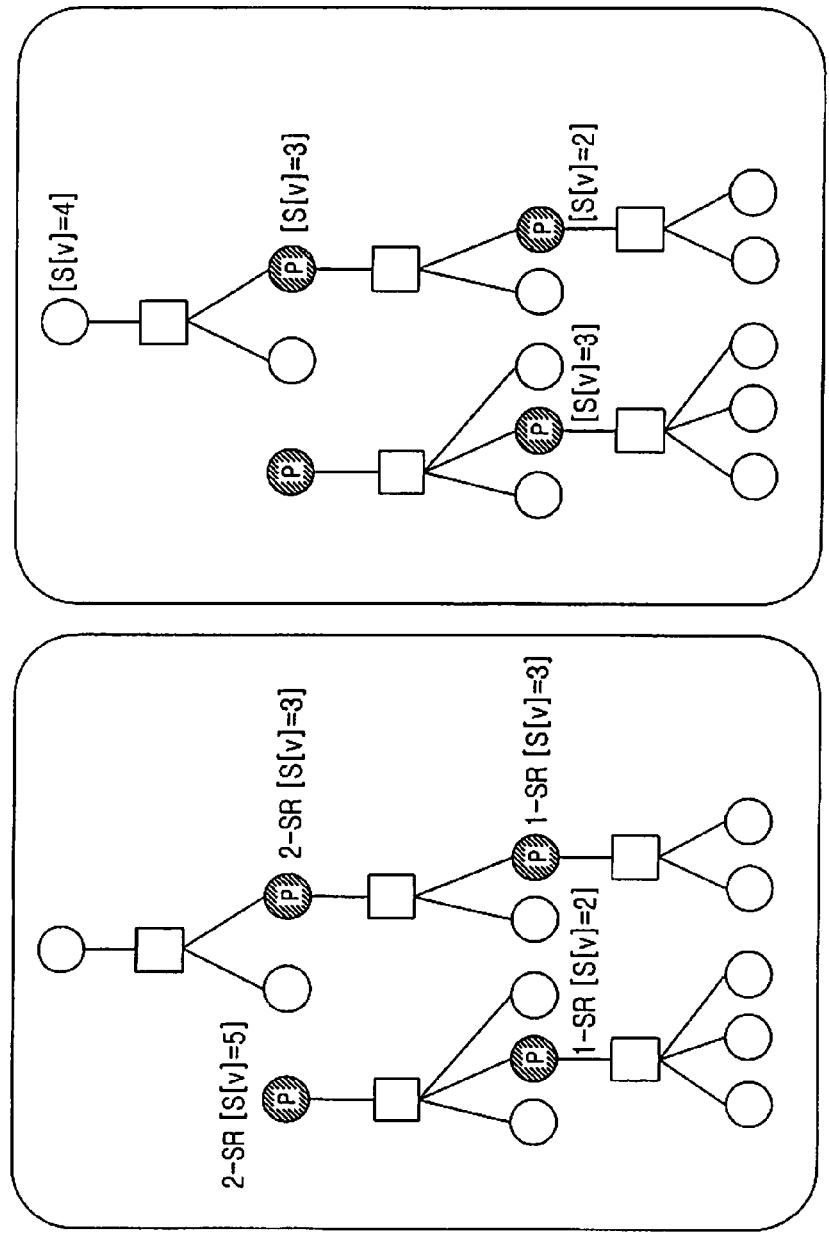
FIGS. 7A and 7B illustrate a conventional recovery tree and a recovery tree according to an embodiment of the present invention.

FIG. 7A illustrates a conventional recovery tree, and FIG. 7B illustrates a recovery tree according to an embodiment of the present invention. Especially, FIG. 7B schematically illustrates variable nodes according to an embodiment of the present invention and a recovery tree corresponding to the variable nodes.

In FIGS. 7A and 7B, s(v) denotes a sum of successors v' recorded in T(v,c,k) and corresponds to the number of unpunctured variable nodes used for recovery of the k-SR node v. Further, S(c) refers to a sum of s(v) values of variable nodes v belonging to $V_c$ and is inverse proportional to the recovery exactness provided to the k-SR node, which is one variable node of $V_c$. In an embodiment of the present invention, S(c) values of all surviving check nodes c within each recovery tree are minimized. Therefore, in an embodiment of the present invention, variable nodes to be punctured within each recovery tree are updated from minimum unpunctured nodes. In a more detailed description about reservation of the check node and the variable node, check nodes having r(c) of "1" (i.e. reserved check nodes) serve as minimum surviving check nodes for recovery of neighboring punctured nodes. Use of the above-described reservation scheme allows uniform allocation of surviving check nodes to punctured nodes, so that the punctured nodes have the same recovery reliability. In FIGS. 7A and 7B, the SR nodes have been changed with reference to s(v), for comparison between an embodiment of the present invention and the conventional technology.

Next, selection of a check node and a variable node according to an embodiment of the present invention is described with reference to FIGS. 8A and 8B.

Figure 8:
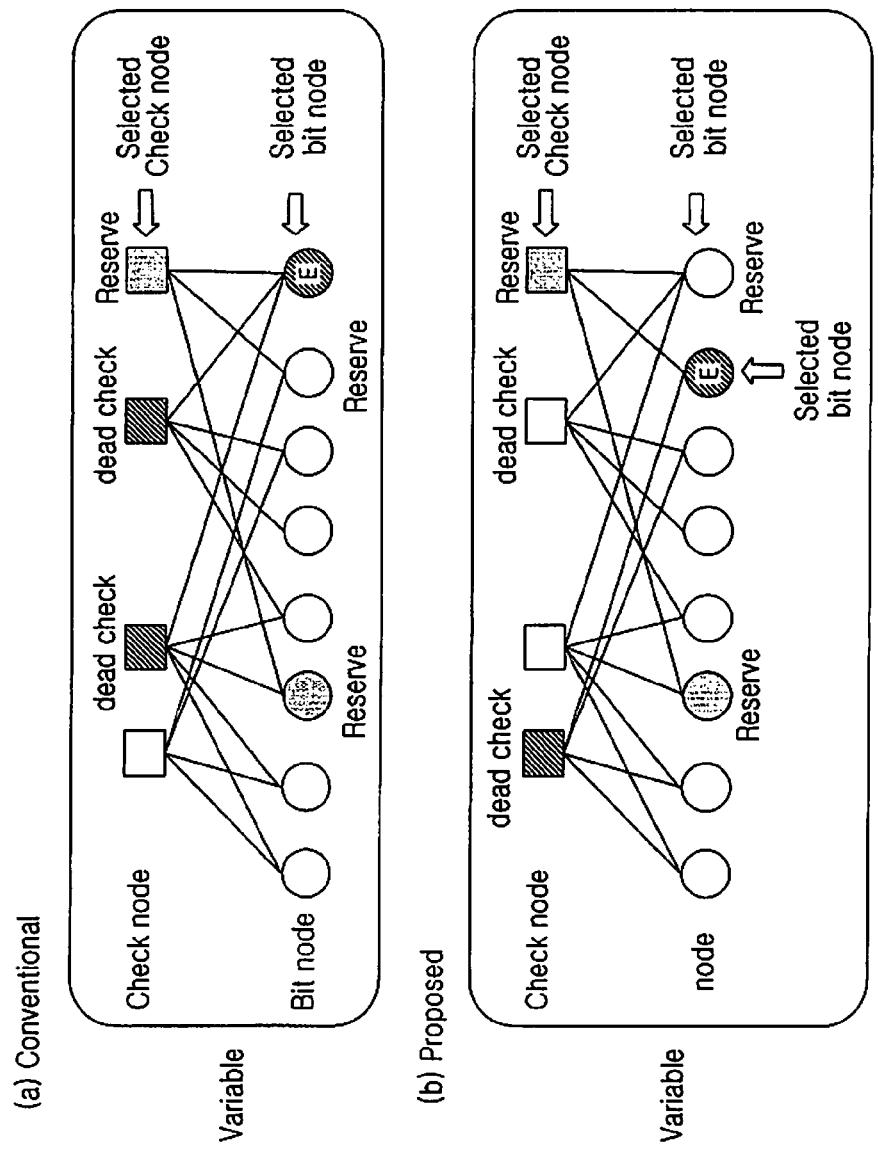
FIGS. 8A and 8B illustrate a conventional selection of a check node and a variable node and selection of a check node and a variable node according to an embodiment of the present invention.

FIG. 8A illustrates a conventional selection of a check node and a variable node and FIG. 8B illustrates selection of a check node and a variable node according to an embodiment of the present invention.

In selection according to an embodiment of the present invention, unreserved check nodes are left as many as possible. That is, a check node connected to a least number of variable nodes connected to unpunctured check nodes is selected. This selection of an embodiment of the present invention achieves a minimization of the number of protected variable nodes and an increase in the recovery probability of punctured nodes.

Further, an unpunctured variable node having a least degree of protection is selected. Thereafter, a variable node having a least bit degree is punctured. Then, the quantity of increase in the number of unpunctured variable nodes connected to all the check nodes is minimized whenever such puncturing is performed. Further, overlapping of surviving check nodes of a predetermined punctured bit with surviving check nodes of another punctured bit is prevented as much as possible. In the conventional variable node selection, since a maximum number of surviving check nodes are selected from the initial stage, so it is possible to note a later overlapping and reduction of surviving check nodes. The variable node selection according to an embodiment of the present invention prevents initial information update of unpunctured variables as little as possible.

In bit selection according to an embodiment of the present invention, a bit node (i.e. variable node) connected to a least number of unpunctured variable nodes from among variable nodes having the least bit degree is punctured. Then, it is possible to further minimize and more uniformly increase the number of whole unpunctured variable nodes.

Hereinafter, a puncturing priority order of nodes having the same bit degree according to an embodiment of the present invention are described with reference to FIG. 9.

Figure 9:
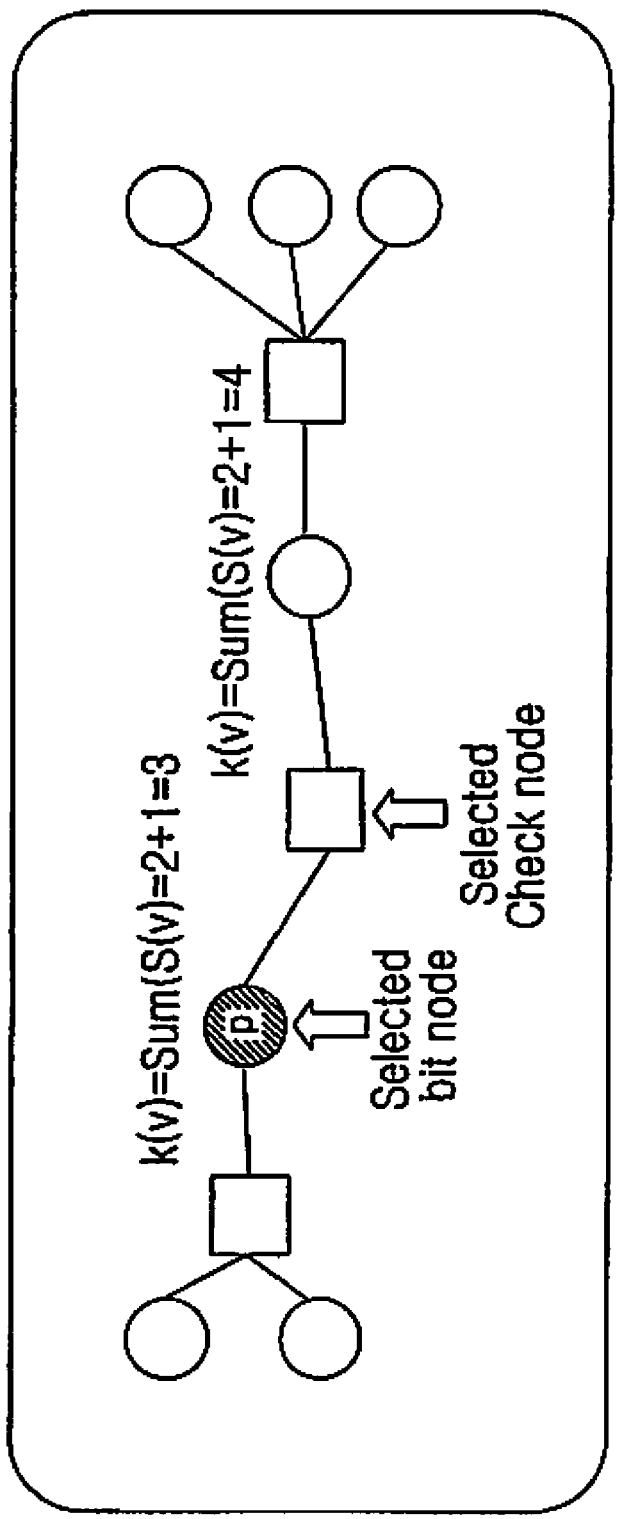
FIG. 9 is a diagram illustrating a puncturing priority order according to an embodiment of the present invention.

FIG. 9 is a schematic view illustrating a puncturing priority order according to an embodiment of the present invention.

FIG. 9 illustrates a puncturing priority order of nodes having the same bit degree based on the selected check node. According to the puncturing priority order, variable nodes having small k(v) indicating a sum of S(c) of c belonging to Cv from among the nodes having the same bit degree are punctured.

Next, recovery trees of check nodes c neighboring variable nodes v are described with reference to FIG. 10.

Figure 10:
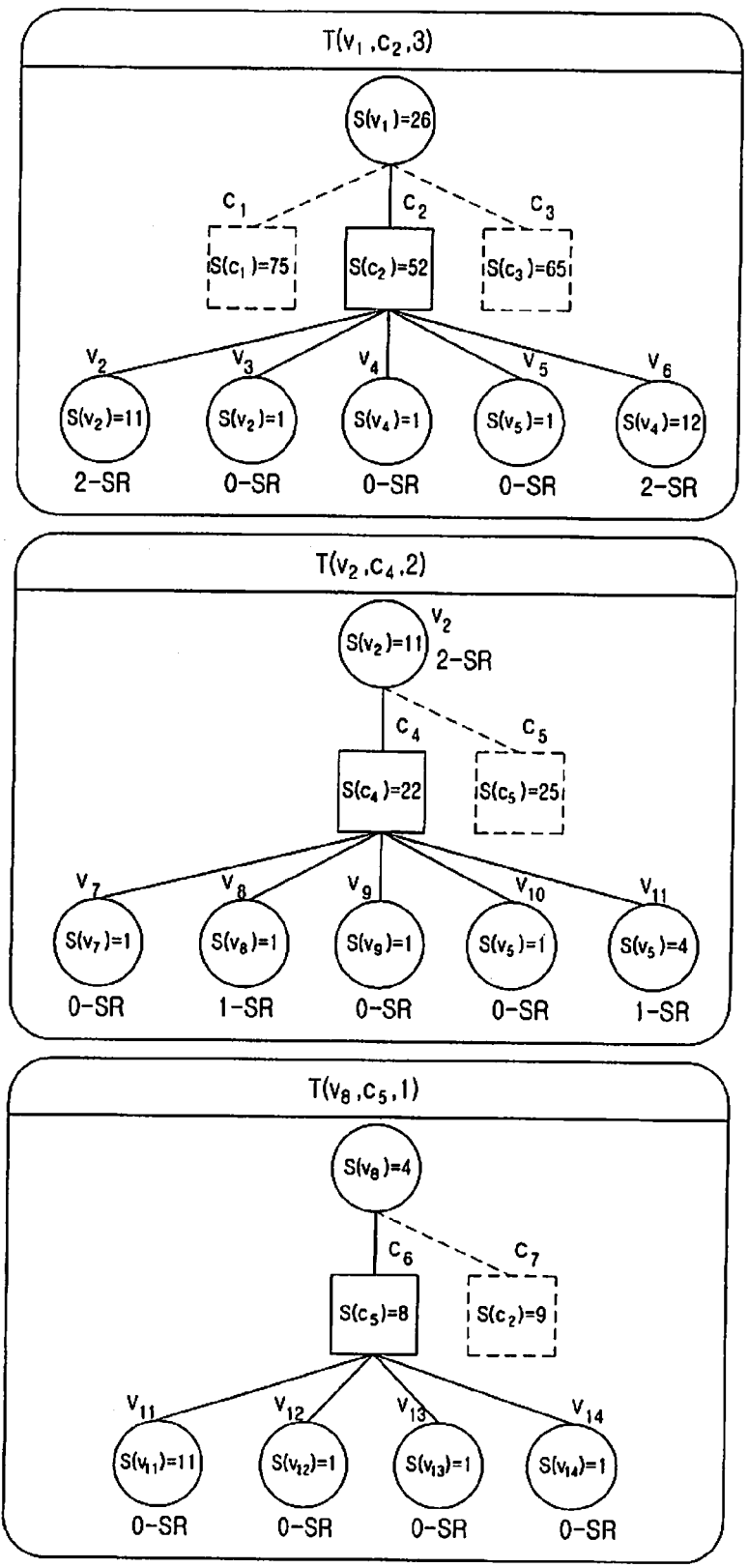
FIG. 10 is a diagram illustrating recovery trees of check nodes c neighboring variable nodes v according to an embodiment of the present invention.

FIG. 10 is a schematic view illustrating recovery trees of check nodes c neighboring variable nodes v according to an embodiment of the present invention.

FIG. 10 shows three recovery trees according to an embodiment of the present invention. In the lowermost recovery tree of $v_8$ and $c_5$, $v_8$ is a 1-SR node recovered from four 0-SR nodes through $c_5$. Further, the lowermost recovery tree shows that $c_5$ instead of $c_2$ is selected as a check node, because $s(c_2)=9$ and $s(c_5)=8$, that is, $c_5$ has a smaller s(c) than $c_2$. The other two upper trees show a 2-SR node and a 3-SR node, respectively.

Next, an embodiment of the present invention is described with reference to FIGS. 11A to 11D.

FIGS. 11A to 11D schematically illustrate a puncturing scheme according to an embodiment of the present invention.

FIGS. 11A to 11D correspond to bipartite graphs of LDPC codes having a coding rate of ½ and a length of 8.

Figure 11A:
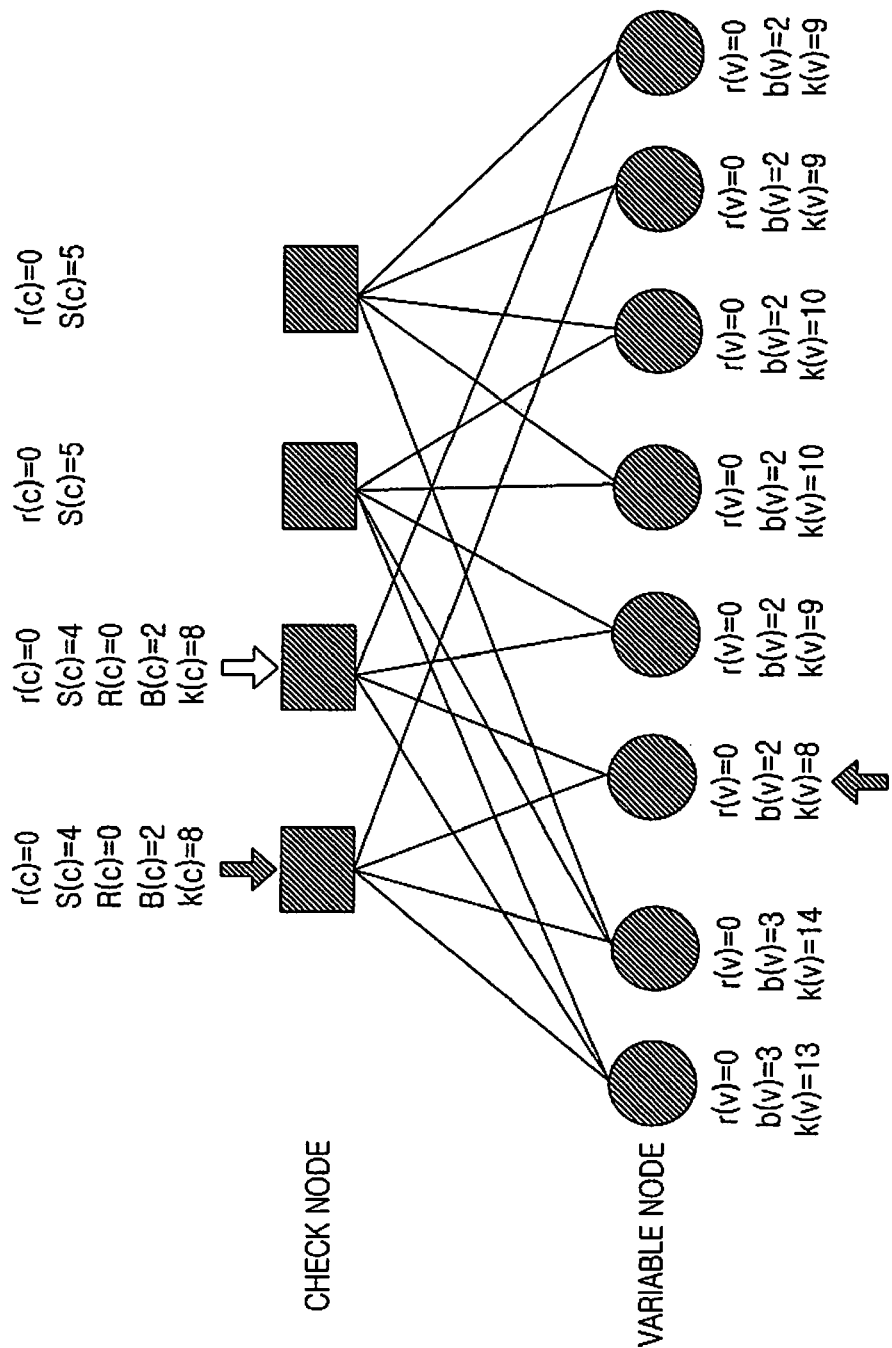
FIGS. 11A to 11D schematically illustrate a puncturing scheme according to an embodiment of the present invention.

Referring to FIG. 11A, a cost function of all check nodes is first calculated. There exist two check nodes having a least cost function according to a result of the calculation of the cost function. The two check nodes having the least cost function are indicated by arrows in the upper portion of FIG. 11A.

It is assumed that one of the two check nodes has been optionally selected, and the selected check node is indicated by the arrow hatched by slant lines. In FIG. 11A, k(v) denotes a sum of s(c) values of check nodes c belonging to $C_v$ and K(c) denotes a minimum value from among k(v) of variable nodes v belonging to $V_c$. The selected variable node is indicated by an arrow hatched by slant lines in a lower portion of FIG. 11A. The cost function includes s(c), R(c), B(c), K(c), r(v), b(v), and k(v).

Figure 11B:
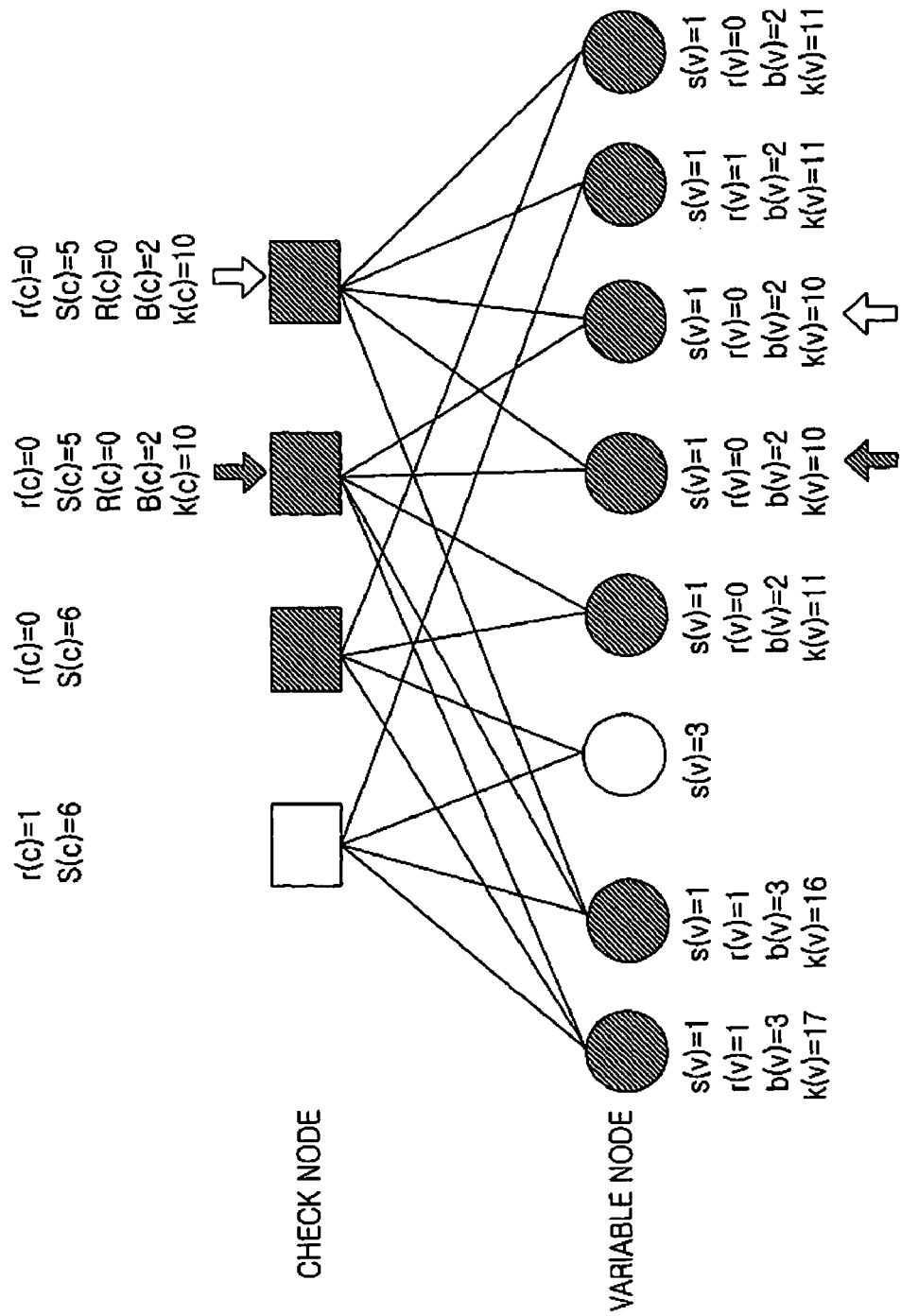

Next, referring to FIG. 11B, the check node selected in FIG. 11A is reserved, and the reserved check node is marked as a white rectangle. Further, the previously selected variable node is punctured. A cost function of all unreserved check nodes is calculated, and two check nodes having a least cost function are selected based on a result of the calculation of the cost function. Then, the selected two check nodes are indicated by arrows in the upper portion of FIG. 11B. It is assumed that one of the two check nodes has been optionally selected, and the selected check node is indicated by the arrow hatched by slant lines. Then, a cost function of all variable nodes connected to the selected check node is calculated, and variable nodes having a least cost function are selected. At this time, there are two check nodes having the least cost function, and one of the two check nodes is optionally selected and punctured. The selected two variable nodes are indicated by arrows under the selected two variable nodes in FIG. 11B, and the variable node to be punctured is indicated by the arrow hatched by slant lines. The cost function of the check nodes uses B(c), and the cost function of the variable nodes uses b(v).

Figure 11C:
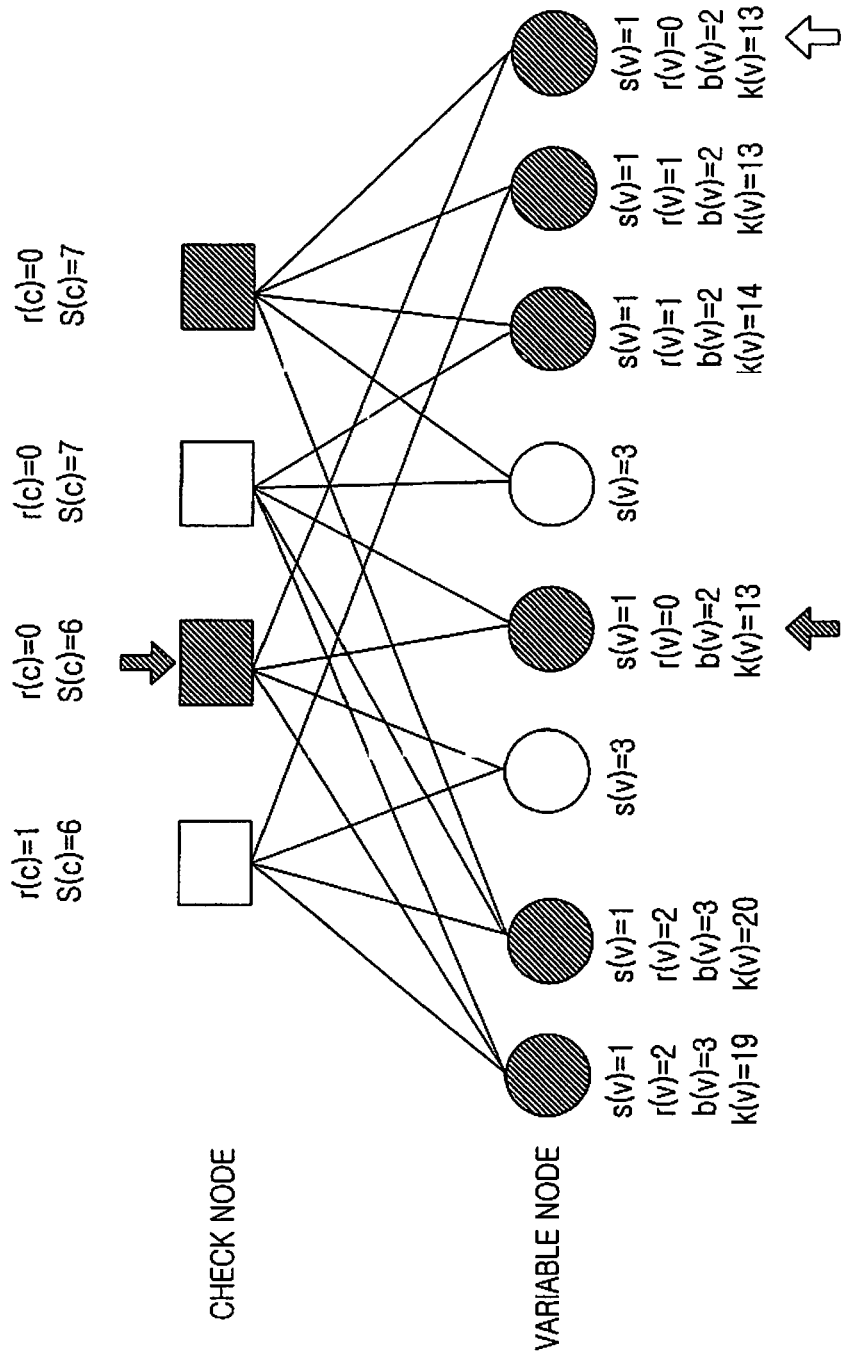

Next, referring to FIG. 11C, the check nodes selected in FIG. 11A and FIG. 11B are marked as white rectangles. Further, the previously selected variable node is punctured. Next, a cost function of all unreserved check nodes is calculated, and a check node having a least cost function is selected based on a result of the calculation of the cost function. Then, the selected check node is indicated by an arrow hatched by slant lines. Then, a cost function of all variable nodes connected to the selected check node is calculated, and variable nodes having a least cost function are selected. At this time, there are two variable nodes having the least cost function, and one of the two variable nodes is optionally selected and punctured. The selected two variable nodes are indicated by arrows under the selected two variable nodes in FIG. 11C, and one variable node to be punctured is indicated by the arrow hatched by slant lines.

Figure 11D:
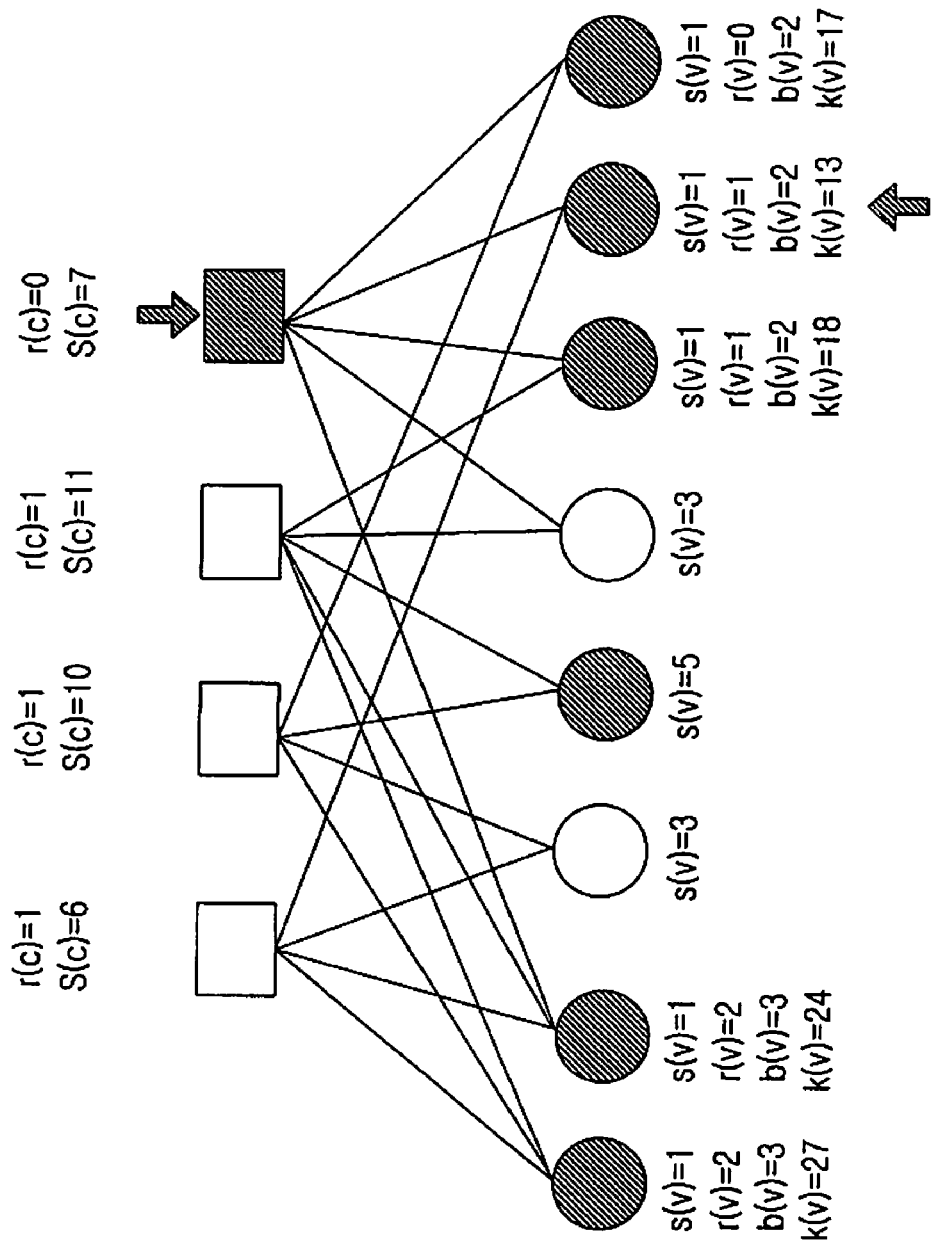

Next, referring to FIG. 11D, the check nodes selected in FIG. 11A, FIG. 11B, and FIG. 11C are marked as white rectangles. Then, a check node is selected, a cost function of all variable nodes connected to the selected check node is calculated, and a variable node having a least cost function is selected. At this time, the selected variable node is indicated by the arrow hatched by slant lines. However, a stopping set examination is performed before the puncturing of the selected variable node, and the puncturing is stopped when the stopping set examination results in a failure. When there remain nodes to be punctured and it is necessary to stop the puncture according to the above-described puncturing scheme, an orderly puncturing is performed from a variable node having a bit with the smallest degree. Next, a performance graph according to an embodiment of the present invention is described with reference to FIG. 12.

Figure 12:
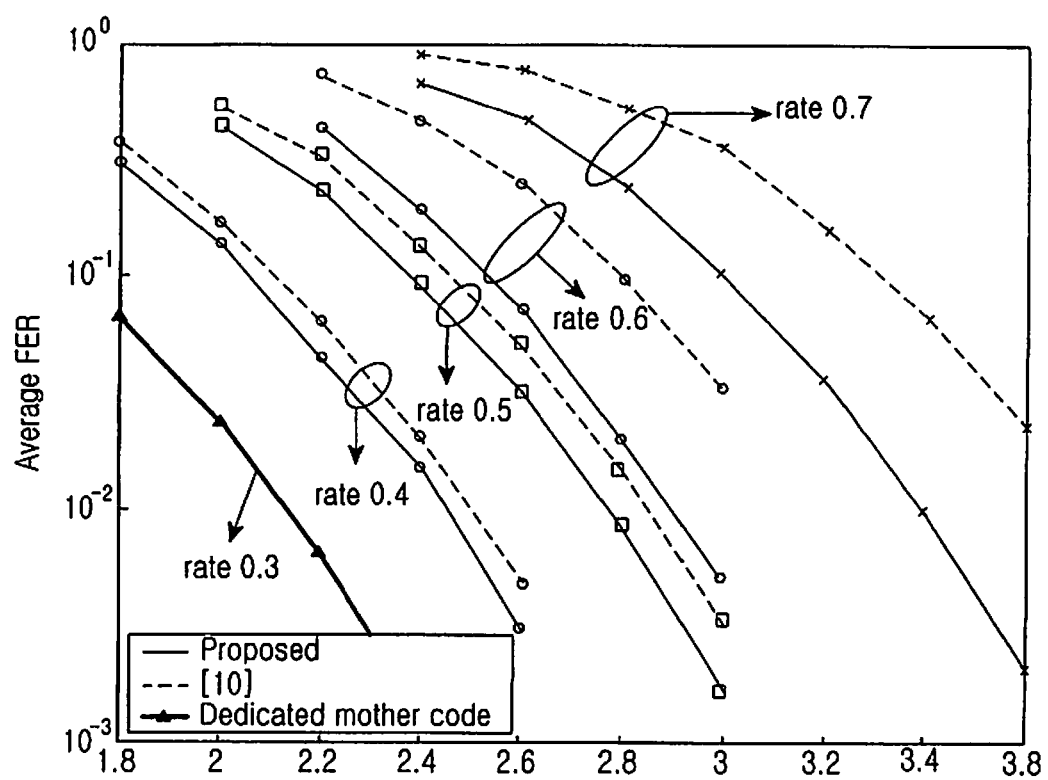
FIG. 12 is a graph illustrating a performance of a puncturing scheme according to an embodiment of the present invention.

FIG. 12 is a graph illustrating a performance of a puncturing scheme according to an embodiment of the present invention.

FIG. 12 shows a result obtained by measuring average Frame Error Rates (FERs) of the conventional puncturing scheme and a puncturing scheme of an embodiment of the present invention for coding rates of 0.3 to 0.7. It is noted from FIG. 12 that the puncturing scheme of an embodiment of the present invention is superior to the conventional puncturing scheme for each coding rate. The conventional puncturing scheme begins puncturing of a 0-SR node above a coding rate of 0.6, and thus shows an inferior EFR performance to an embodiment of the present invention.

According to embodiments of the present invention as described above, it is possible to support various coding rates for signal transmission/reception in a communication system using an LDPC code. Further, it is possible to transmit and receive signals through an effective puncturing scheme in a communication system using an LDPC code, and to minimize the number of unpunctured variable nodes of a recovery tree of reserved check nodes and each punctured node, thereby maximizing the recovery correctness. Moreover, it is possible to maximize the reliability in recovery of punctured nodes, to further enhance the recovery reliability by first puncturing a variable node having a smallest degree, and to maintain a uniform recovery performance for all punctured nodes. In addition, according to embodiments of the present invention, it is possible to prevent punctured variable nodes from configuring a stopping set in LDPC codes.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for transmitting a signal in a communication system, the method comprising the steps of:
   encoding an information vector according to a Low Density Parity Check (LDPC) encoding scheme, thereby generating an LDPC codeword;
   reserving a minimum number of surviving check nodes for recovery of neighboring punctured nodes in the LDPC codeword;
   selecting a check node having a smallest cost function from among unreserved check nodes;
   selecting a variable node being unpunctured and having a smallest cost function from among variable nodes connected to the selected check node;
   puncturing the selected variable node when the selected variable node is not connected to one of the reserved check nodes;
   performing a stopping set check when the selected variable node is connected to one of the reserved check nodes;
   puncturing the variable node when the stopping set check has been successfully performed; and
   selecting the check node until there remains no variable node to be punctured and puncturing the variable node;
   wherein the cost function represents a puncturing order, and the larger a value of the cost function, the earlier the puncturing order.

2. The method of claim 1, wherein the cost function for selection of the check node is defined by $$C(c)=S(c)+R(c)w^{-1}+B(c)w^{-2}+K(c)w^{-3},$$

$$C(v)=r(v)+b(v)w^{-1}+k(v)w^{-2}$$

wherein C(c) denotes the cost function of the check node, S(c) denotes a sum of s(v) values of variable nodes v included in $V_c$, R(c) denotes a minimum value from among r(v) values of variable nodes v included in $V_c$, B(c) denotes a minimum value of b(v) of variable nodes v having a minimum r(v) value included in $V'_c$, K(c) denotes a minimum value from among k(v) of variable nodes v included in $V_c$, w denotes a predetermined real number having a large value, $V_c$ denotes a set of variable nodes connected to a check node c, s(v) denotes a sum of s(v') values of each sub-tree in T(v, c, k), v' denotes one of the (k−1)-SR node and the 0-SR node, T(v, c, k) denotes a recovery tree of a surviving check node c that has at least a minimum number of (k−1)-SR nodes and 0-SR nodes in a sub-tree from among k-SR nodes v and $C_v$, $V'_c$ denotes a set of variable nodes v belonging to $V_c$, wherein p(v) of the variable nodes v is 1 and r(v) of the variable nodes v has a minimum value, r(v) denotes a sum of r(c) values of check nodes c belonging to $C_v$, p(v) denotes a puncturing state of a variable node v, r(c) denotes a reserved state of a check node c, b(v) denotes a degree of a variable node v, and k(v) denotes a sum of S(c) values of check nodes c belonging to $C_v$.

3. The method of claim 1, wherein the cost function for selection of the variable node is defined by $$C(v)=r(v)+b(v)w^{-1}+k(v)w^{-2},$$

wherein C(v) denotes the cost function of the variable node, r(v) denotes a sum of r(c) values of check nodes c belonging to $C_v$, b(v) denotes a degree of a variable node v, k(v) denotes a sum of S(c) values of check nodes c belonging to $C_v$, w denotes a predetermined real number having a large value, r(c) denotes a reserved state of a check node c, $C_v$ denotes a set of check nodes connected to a variable node v, S(c) denotes a sum of s(v) values of variable nodes v included in $V_c$, s(v) denotes a sum of s(v') values of each sub-tree in T(v, c, k), v' denotes one of the (k−1)-SR node and the 0-SR node, and T(v, c, k) denotes a recovery tree of a surviving check node c that has at least a minimum number of (k−1)-SR nodes and 0-SR nodes in a sub-tree from among k-SR nodes v and $C_v$.

4. The method of claim 1, wherein, in the stopping-set-check, it is checked if a current variable node to be punctured can be recovered through iterative decoding of another variable node.

5. The method of claim 1, wherein the stopping-set-check is performed by:
   checking if check nodes connected to the punctured variable node include at least one unpunctured variable node from among all variable nodes except for the punctured variable node;
   setting the punctured variable node as an unpunctured variable node when the check nodes connected to the punctured variable node include at least one unpunctured variable node from among all variable nodes except for the punctured variable node;
   checking the punctured variable node until the punctured variable node becomes a final variable node;
   when the punctured variable node is the final variable node, decreasing the number of times of iterative decoding by 1; and
   determining the stopping-set-check as a success when there does exist a punctured variable node before the number of times of iterative decoding becomes 0.

6. The method of claim 5, wherein the stopping-set-check is sequentially performed from a leftmost punctured variable node.

7. An apparatus for transmitting a signal in a communication system, the apparatus comprising:
   an encoder for encoding an information vector according to a Low Density Parity Check (LDPC) encoding scheme, thereby generating an LDPC codeword; and a puncturing unit for reserving a minimum number of surviving check nodes for recovery of punctured nodes in the LDPC codeword, selecting a check node having a smallest cost function from among unreserved check nodes, selecting a variable node being unpunctured and having a smallest cost function from among variable nodes connected to the selected check node, puncturing the selected variable node when the selected variable node is not connected to one of the reserved check nodes, performing a stopping set check when the selected variable node is connected to one of the reserved check nodes, puncturing the variable node when the stopping set check has been successfully performed, and selecting the check node until there remains no variable node to be punctured and puncturing the variable node;

wherein the cost function represents a puncturing order, and the larger a value of the cost function, the earlier the puncturing order.

8. The apparatus of claim 7, wherein the cost function for selection of the check node is defined by $$C(c)=S(c)+R(c)w^{-1}+B(c)w^{-2}+K(c)w^{-3},$$

$$C(v)=r(v)+b(v)w^{-1}+k(v)w^{-2}$$

wherein C(c) denotes the cost function of the check node, S(c) denotes a sum of s(v) values of variable nodes v included in $V_c$, R(c) denotes a minimum value from among r(v) values of variable nodes v included in $V_c$, B(c) denotes a minimum value of b(v) of variable nodes v having a minimum r(v) value included in $V'_c$, K(c) denotes a minimum value from among k(v) of variable nodes v included in $V_c$, w denotes a predetermined real number having a large value, $V_c$ denotes a set of variable nodes connected to a check node c, s(v) denotes a sum of s(v') values of each sub-tree in T(v, c, k), v' denotes one of the (k−1)-SR node and the 0-SR node, T(v, c, k) denotes a recovery tree of a surviving check node c that has at least a minimum number of (k−1)-SR nodes and 0-SR nodes in a sub-tree from among k-SR nodes v and $C_v$, $V'_c$ denotes a set of variable nodes v belonging to $V_c$, wherein p(v) of the variable nodes v is 1 and r(v) of the variable nodes v has a minimum value, r(v) denotes a sum of r(c) values of check nodes c belonging to $C_v$, p(v) denotes a puncturing state of a variable node v, r(c) denotes a reserved state of a check node c, b(v) denotes a degree of a variable node v, and k(v) denotes a sum of S(c) values of check nodes c belonging to $C_v$.

9. The apparatus of claim 7, wherein the cost function for selection of the variable node is defined by $$C(v)=r(v)+b(v)w^{-1}+k(v)w^{-2},$$

wherein C(v) denotes the cost function of the variable node, r(v) denotes a sum of r(c) values of check nodes c belonging to $C_v$, b(v) denotes a degree of a variable node v, k(v) denotes a sum of S(c) values of check nodes c belonging to $C_v$, w denotes a predetermined real number having a large value, r(c) denotes a reserved state of a check node c, $C_v$ denotes a set of check nodes connected to a variable node v, S(c) denotes a sum of s(v) values of variable nodes v included in $V_c$, s(v) denotes a sum of s(v') values of each sub-tree in T(v, c, k), v' denotes one of the (k−1)-SR node and the 0-SR node, and T(v, c, k) denotes a recovery tree of a surviving check node c that has at least a minimum number of (k−1)-SR nodes and 0-SR nodes in a sub-tree from among k-SR nodes v and $C_v$.

10. The apparatus of claim 7, wherein, in the stopping-set-check, it is checked if a current variable node to be punctured can be recovered through iterative decoding of another variable node.

11. The apparatus of claim 7, wherein the stopping-set-check is performed by:
checking if check nodes connected to the punctured variable node include at least one unpunctured variable node from among, all variable nodes except for the punctured variable node;
setting the punctured variable node as an unpunctured variable node when the check nodes connected to the punctured variable node include at least one unpunctured variable node from among all variable nodes except for the punctured variable node;
checking the punctured variable node until the punctured variable node becomes a final variable node;
when the punctured variable node is the final variable node, decreasing the number of times of iterative decoding by 1; and
determining the stopping-set-check as a success when there does exist a punctured variable node before the number of times of iterative decoding becomes 0.

12. The apparatus of claim 11, wherein the stopping-set-check is sequentially performed from a leftmost punctured variable node.

* * * * *